(12) United States Patent
Mishima

(10) Patent No.: US 10,986,292 B2
(45) Date of Patent: Apr. 20, 2021

(54) SOLID-STATE IMAGE PICKUP DEVICE AND ELECTRONIC APPARATUS TO INCREASE YIELD

(71) Applicant: SONY SEMICONDUCTOR SOLUTIONS CORPORATION, Kanagawa (JP)

(72) Inventor: Kenji Mishima, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/774,757

(22) PCT Filed: Nov. 16, 2016

(86) PCT No.: PCT/JP2016/083902
§ 371 (c)(1),
(2) Date: May 9, 2018

(87) PCT Pub. No.: WO2017/094502
PCT Pub. Date: Jun. 8, 2017

(65) Prior Publication Data
US 2018/0332245 A1 Nov. 15, 2018

(30) Foreign Application Priority Data
Nov. 30, 2015 (JP) .............................. JP2015-233451

(51) Int. Cl.
*H04N 5/369* (2011.01)
*H01L 27/14* (2006.01)
(Continued)

(52) U.S. Cl.
CPC ............. *H04N 5/369* (2013.01); *H01L 23/28* (2013.01); *H01L 24/42* (2013.01); *H01L 27/14* (2013.01);
(Continued)

(58) Field of Classification Search
CPC ...... H04N 5/369; H04N 5/2253; H01L 24/42; H01L 27/14618; H01L 23/28;
(Continued)

(56) References Cited

U.S. PATENT DOCUMENTS 8,034,652 B2 * 10/2011 Nishida ............... H01L 21/6835
438/294
2009/0283887 A1 11/2009 Takayama
(Continued)

FOREIGN PATENT DOCUMENTS

CN 102138215 A 7/2011
JP 63-63425 A 3/1988
(Continued)

OTHER PUBLICATIONS

International Search Report and Written Opinion of PCT Application No. PCT/JP2016/083902, dated Jan. 17, 2017, 11 pages of ISRWO.

*Primary Examiner* — Padma Haliyur
(74) *Attorney, Agent, or Firm* — Chip Law Group

(57) ABSTRACT

The present technology relates to a solid-state image pickup device, a manufacturing method thereof, and an electronic apparatus that make it possible to increase the yield. The solid-state image pickup device includes an optical sensor including a light receiving unit and a cover glass provided on the light receiving unit's side of the optical sensor. The cover glass includes a chamfered portion at a ridge portion that surrounds a surface on the optical sensor's side. The present technology can be applied to, for example, a package for a CMOS image sensor.

9 Claims, 14 Drawing Sheets

(51) Int. Cl.
*H04N 5/225* (2006.01)
*H01L 23/28* (2006.01)
*H01L 23/00* (2006.01)
*H01L 27/146* (2006.01)

(52) U.S. Cl.
CPC ..... *H01L 27/14618* (2013.01); *H04N 5/2251* (2013.01); *H04N 5/2253* (2013.01); *H01L 24/32* (2013.01); *H01L 24/45* (2013.01); *H01L 24/48* (2013.01); *H01L 24/73* (2013.01); *H01L 2224/06155* (2013.01); *H01L 2224/32225* (2013.01); *H01L 2224/45139* (2013.01); *H01L 2224/45144* (2013.01); *H01L 2224/45147* (2013.01); *H01L 2224/48095* (2013.01); *H01L 2224/48227* (2013.01); *H01L 2224/73265* (2013.01); *H01L 2224/92247* (2013.01); *H01L 2924/16235* (2013.01); *H01L 2924/16315* (2013.01); *H01L 2924/16788* (2013.01)

(58) Field of Classification Search
CPC ............... H01L 27/14; H01L 24/45; H01L 2224/32225; H01L 2224/45139; H01L 2224/45144; H01L 2224/45147; H01L 2224/48095; H01L 2224/48227; H01L 2224/06155; H01L 2224/73265

See application file for complete search history.

(56) References Cited

U.S. PATENT DOCUMENTS

| 2010/0176476 A1 | 7/2010 | Takayama et al. |
| 2011/0147782 A1 | 6/2011 | Sano et al. |

FOREIGN PATENT DOCUMENTS

| JP | 63-063425 A | 3/1988 |
| JP | 03-011757 A | 1/1991 |
| JP | 06-41145 U | 5/1994 |
| JP | 06-041145 U | 5/1994 |
| JP | 2008-041696 A | 2/2008 |
| JP | 2008-182051 A | 8/2008 |
| JP | 2009-277950 A | 11/2009 |
| JP | 2010-123671 A | 6/2010 |
| JP | 2010-177569 A | 8/2010 |
| JP | 2010-177600 A | 8/2010 |
| JP | 2011-054925 A | 3/2011 |
| WO | 2010/086926 A1 | 8/2010 |

* cited by examiner

PRIOR ART

PRIOR ART

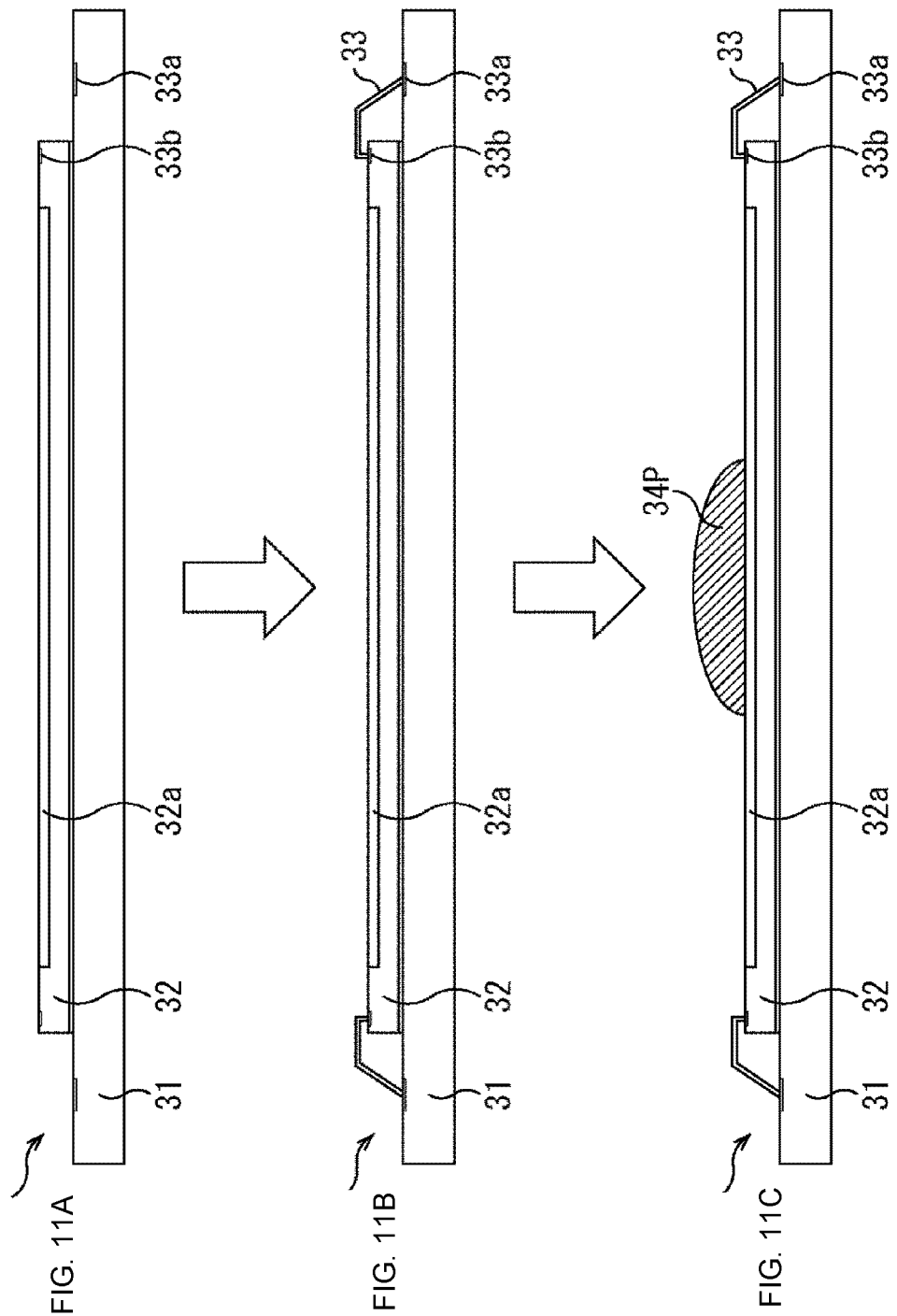

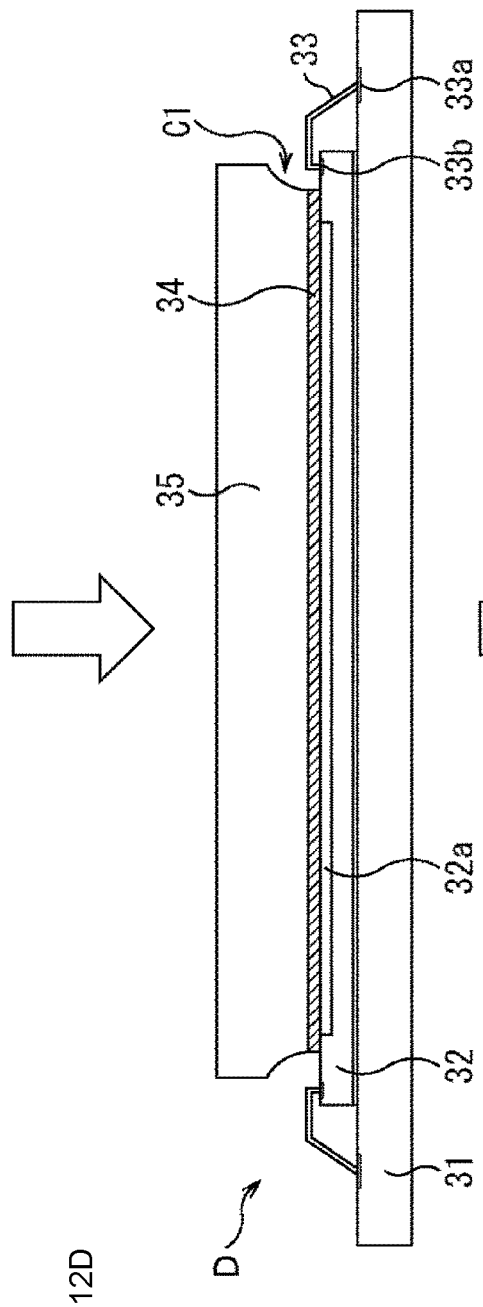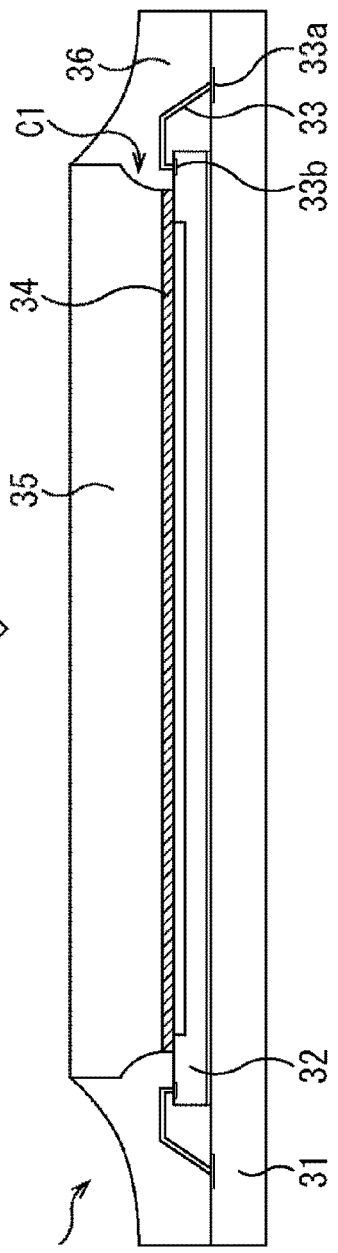
FIG. 12D
FIG. 12E

SOLID-STATE IMAGE PICKUP DEVICE AND ELECTRONIC APPARATUS TO INCREASE YIELD

CROSS REFERENCE TO RELATED APPLICATIONS

This application is a U.S. National Phase of International Patent Application No. PCT/JP2016/083902 filed on Nov. 16, 2016, which claims priority benefit of Japanese Patent Application No. JP 2015-233451 filed in the Japan Patent Office on Nov. 30, 2015. Each of the above-referenced applications is hereby incorporated herein by reference in its entirety.

TECHNICAL FIELD

The present technology relates to a solid-state image pickup device, a manufacturing method thereof, and an electronic apparatus, and in particular relates to a solid-state image pickup device, a manufacturing method thereof, and an electronic apparatus that make it possible to increase the yield.

BACKGROUND ART

For the purpose of downsizing and thinning of a package for an image sensor, a structure is known in which a cover glass is directly pasted to the upper surface of the image sensor (for example, Patent Documents 1 and 2).

CITATION LIST

Patent Document

Patent Document 1: Japanese Patent Application Laid-Open No. 2010-177600
Patent Document 2: Japanese Patent Application Laid-Open No. H3-11757

SUMMARY OF THE INVENTION

In the package having the structure described above, in recent years, the size of the cover glass tends to be expanded along with the area expansion of the light receiving unit of the image sensor. Thus, a distance between the cover glass and a bonding pad provided at the peripheral portion of the image sensor is shortened, and as a result, the yield may be reduced due to a design error.

The present technology has been made in view of such a situation, and it is intended to make it possible to increase the Yield.

Solutions to Problems

A solid-state image pickup device of the present technology includes: an optical sensor including a light receiving unit; and a cover glass provided on the light receiving unit's side of the optical sensor, in which the cover glass includes a chamfered portion at a ridge portion that surrounds a surface on the optical sensor's side.

A manufacturing method of a solid-state image pickup device of the present technology is a manufacturing method of a solid-state image pickup device including an optical sensor including a light receiving unit, and a cover glass provided on the light receiving unit's side of the optical sensor, in which the cover glass includes a chamfered portion at a ridge portion that surrounds a surface on the optical sensor's side, the manufacturing method includes: a first step of forming a first groove having a tapered cross section along a dimension of the cover glass in a glass material larger than the cover glass; and a second step of forming a second groove narrower than a width of an opening of the first groove along the first groove, to cut the glass material.

In the present technology, the chamfered portion is provided on the cover glass at the ridge portion that surrounds the surface on the optical sensor's side.

Effects of the Invention

According to the present technology, the yield can be increased.

BRIEF DESCRIPTION OF DRAWINGS

FIGS. 11A, 11B, and 11C are diagrams illustrating processes in manufacturing of the solid-state image pickup device.
FIGS. 12D and 12E are diagrams illustrating processes in manufacturing of the solid-state image pickup device.

MODE FOR CARRYING OUT THE INVENTION

Hereinafter, embodiments of the present technology are described with reference to the drawings. Note that, description will be made in the order shown below.
1. Structure of Conventional Solid-State Image Pickup Device
2. Structure of Solid-State Image Pickup Device of Present Technology
3. Manufacturing Process of Solid-State Image Pickup Device
4. Formation Process of Cover Glass
5. Configuration Example of Electronic Apparatus
6. Usage Examples of Image Sensor <1. Structure of Conventional Solid-State Image Pickup Device>

Figure 1:
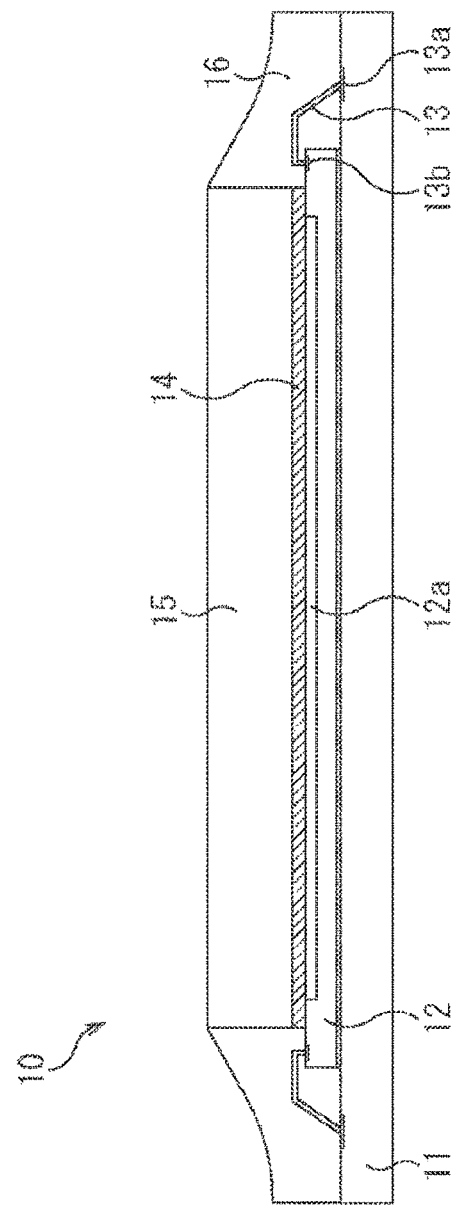
FIG. 1 is a cross-sectional view illustrating a structure of a conventional solid-state image pickup device.

FIG. 1 is a cross-sectional view illustrating a structure of a conventional solid-state image pickup device.

A solid-state image pickup device 10 of FIG. 1 includes a substrate 11, a Complementary Metal Oxide Semiconductor (CMOS) image sensor 12 (hereinafter simply referred to as an image sensor 12) as an optical sensor, a wire 13, a transparent resin 14, a cover glass 15, and a sealing resin 16.

The image sensor 12 includes a light receiving unit 12a, and the cover glass 15 is pasted to the light receiving unit 12a of the image sensor 12, via a transparent resin 14 as an adhesive.

In addition, the substrate 11 and the image sensor 12 are electrically connected together via bonding pads 13a and 13b respectively provided and the wire 13.

With the structure illustrated in FIG. 1, downsizing and thinning of a package for an image sensor can be achieved.

Figure 2:
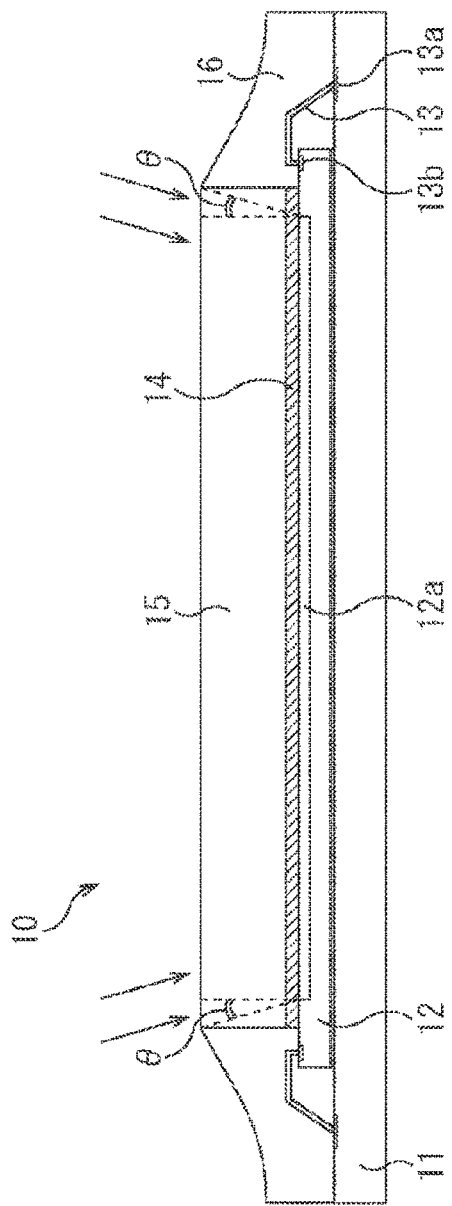
FIG. 2 is a diagram describing a light collecting zone.

In the image sensor package having such a structure, as illustrated in FIG. 2, there is a light collecting zone spreading from the light receiving unit 12a at a predetermined angle θ. The angle θ is set to, for example, about 22° to 25°.

Figure 3:
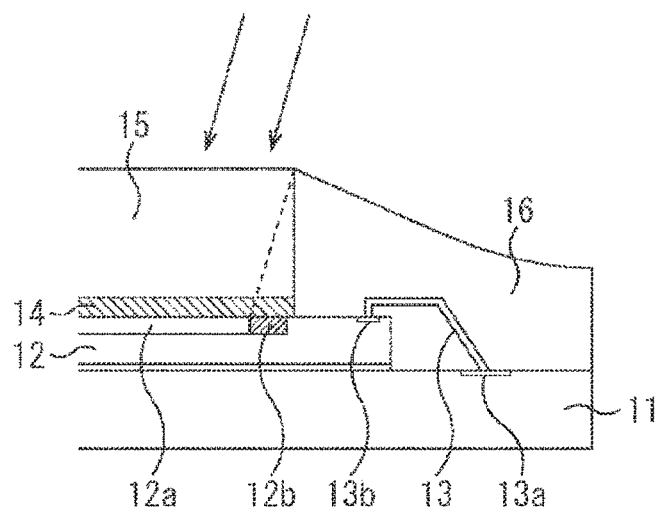
FIG. 3 is a diagram describing vignetting.

Here, in FIG. 2, in a case where a pasting position of the cover glass 15 is shifted to the left side in the figure, as illustrated in FIG. 3, part of light originally incident on the light receiving unit 12a is blocked by the sealing resin 16. As a result, an end portion 12b of the light receiving unit 12a becomes a shadow, and so-called vignetting is caused.

Figure 4:
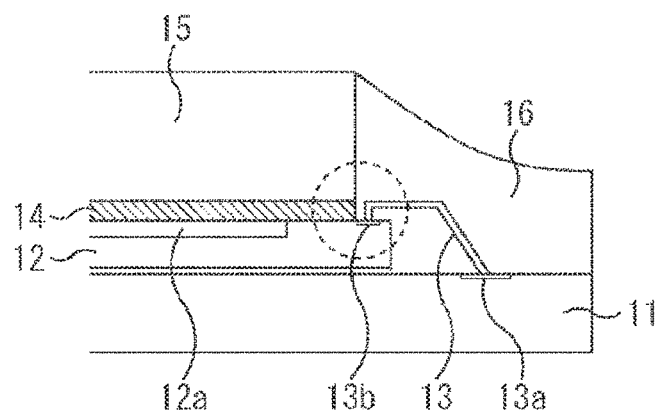
FIG. 4 is a diagram describing a risk of contact with a bonding pad.

In addition, with the recent expansion of the pixel size, the size of the cover glass 15 also tends to be expanded. However, in a case where the size of the cover glass 15 is increased, as illustrated in FIG. 4, the distance between an end portion of the cover glass 15 and the bonding pad 13b becomes short, and a risk of contact is increased.

Figure 5:
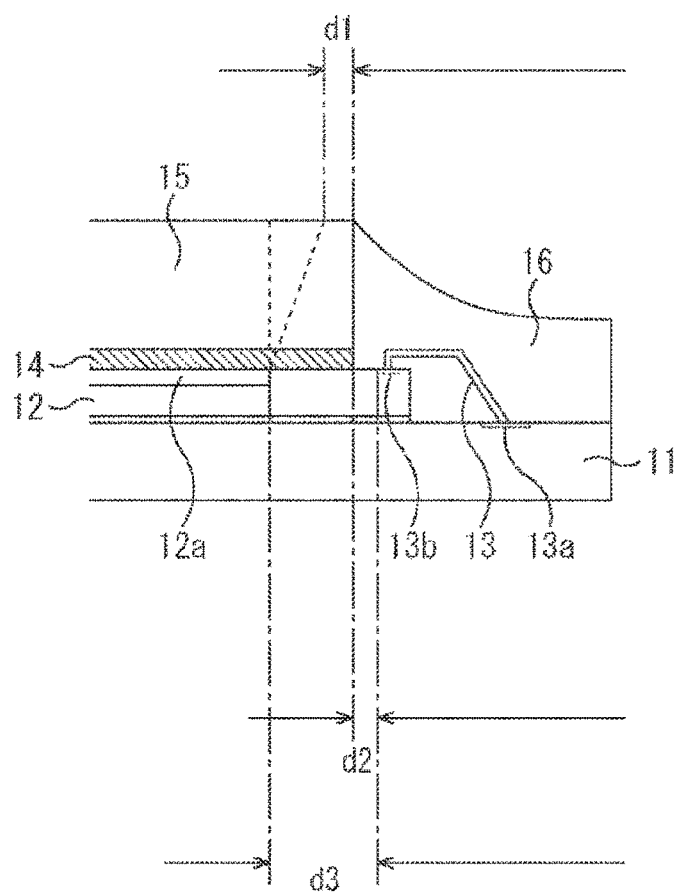
FIG. 5 is a diagram describing a design limit of a solid-state image pickup device.

FIG. 5 is a diagram describing a design limit in the periphery of the cover glass 15 of the solid-state image pickup device 10 described above.

In FIG. 5, d1 indicates a margin for preventing the vignetting, and d2 indicates a margin for preventing the end portion of the cover glass 15 and the bonding pad 13b from contacting each other. In addition, d3 indicates the shortest distance between the light receiving unit 12a and the bonding pad 13b.

Here, for example, as a pasting error on the xy plane of the cover glass 15, assuming that errors in the x and y directions are each 0.075 mm and an error in the rotational direction is 0.5°. In addition, assuming that an outer shape error of the cover glass 15 itself is ±0.03 mm, and chipping of the cover glass 15 is 0.065 mm.

In the case of the conditions described above, 0.12 mm as the margin d1 and 0.081 mm as the margin d2 are required; however, in this case, 0.46 mm is the limit as the shortest distance d3. This fact indicates that currently mass production is to be carried out with an extremely small design margin, or that expansion of the pixel size must be restricted. Note that, the values of the errors under the conditions described above are examples; however, at least it can be said that these errors affect the degree of freedom of design.

<2. Structure of Solid-State Image Pickup Device of Present Technology>

Figure 6:
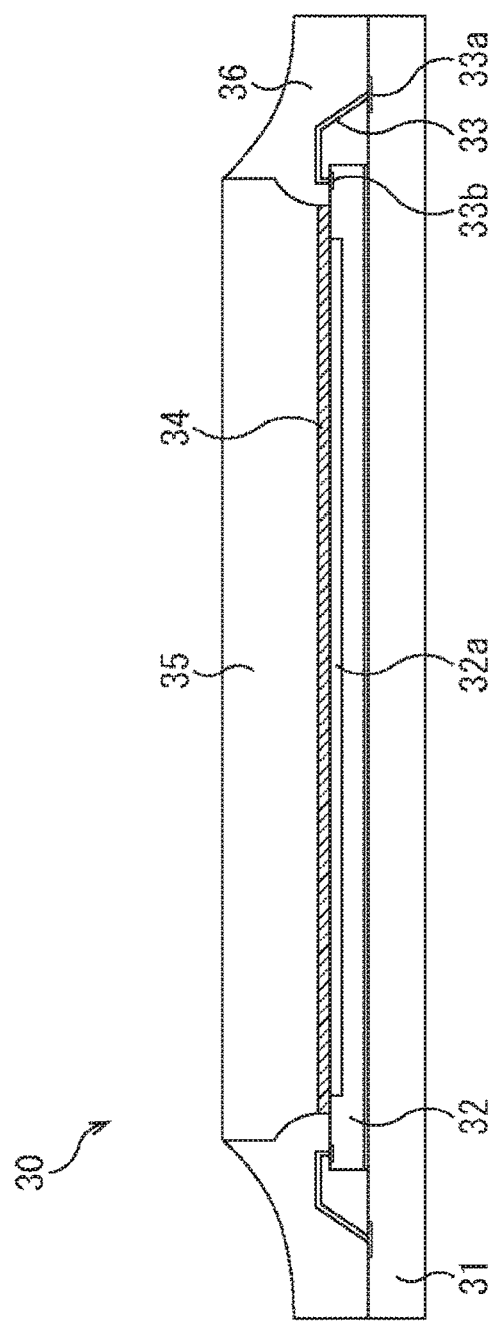
FIG. 6 is a cross-sectional view illustrating a structure of a solid-state image pickup device of the present technology.

FIG. 6 is a cross-sectional view illustrating a structure of an embodiment of a solid-state image pickup device to which the present technology is applied.

A solid-state image pickup device 30 of FIG. 6 includes a substrate 31, a CMOS image sensor 32 (hereinafter simply referred to as an image sensor 32) as an optical sensor, a wire 33, a transparent resin 34, a cover glass 35, and a sealing resin 36.

The substrate 31 includes a material such as ceramic, organic material, plastic, or glass. The material forming the substrate 31 may be any of these materials.

The image sensor 32 is die-bonded onto the substrate 31. The image sensor 32 includes a light receiving unit 32a in which unit pixels (also simply referred to as pixels) each including a photoelectric conversion device are two-dimensionally arranged in a matrix, and detects an electric charge amount corresponding to an amount of light incident on the light receiving unit 32a as a physical quantity for each pixel.

The wire 33 includes a material such as Au, Ag, or Cu. The wire 33 electrically connects the substrate 31 and the image sensor 32 together.

A bonding pad 33a is provided on a peripheral portion except for the image sensor 32, of the substrate 31, and a bonding pad 33b is provided on a peripheral portion except for the light receiving unit 32a, of the image sensor 32. The bonding pad 33a and the bonding pad 33b are connected together by the wire 33 by wire bonding, whereby the substrate 31 and the image sensor 32 are electrically connected together.

The cover glass 35 is pasted to the light receiving unit 32a side of the image sensor 32, with a transparent resin 34 as an adhesive.

Figure 7:
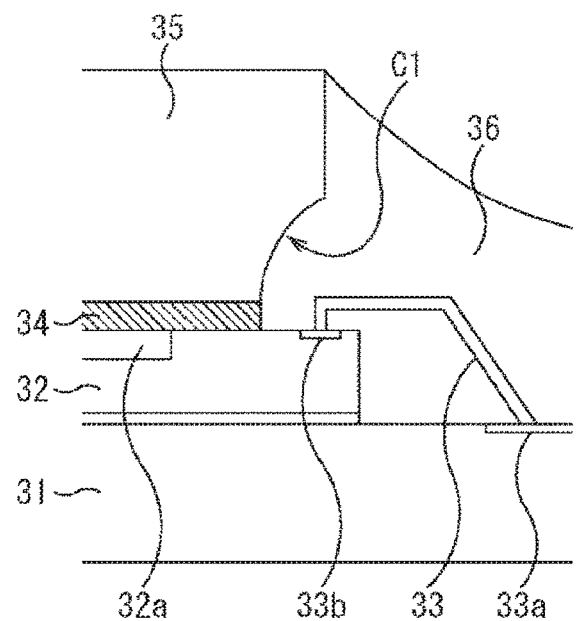
FIG. 7 is a diagram describing a shape of a chamfered portion.

In addition, as illustrated in FIG. 7, the cover glass 35 includes a chamfered portion C1 at a ridge portion that surrounds a surface on the image sensor 32 side.

In the example of FIG. 7, the chamfered portion C1 is formed in a reverse R surface. In this way, the chamfered portion C1 is provided at the ridge portion of the lower surface of the cover glass 35, whereby a clearance can be secured between the cover glass 35 and the wire 33 (bonding pad 33b). Note that, to secure the clearance more reliably, the height of an arch portion of the wire 33 is desirably made to be low. Note that, the shortest distance between an end portion of the light receiving unit 32a and the bonding pad 33b is set to less than or equal to 0.5 mm.

The sealing resin 36 seals the periphery of the cover glass 35 including the chamfered portion C1 together with the wire 33 connected to the bonding pad 33a and the bonding pad 33b. The sealing resin 36 is formed by a molding method or a potting method.

Figure 8:
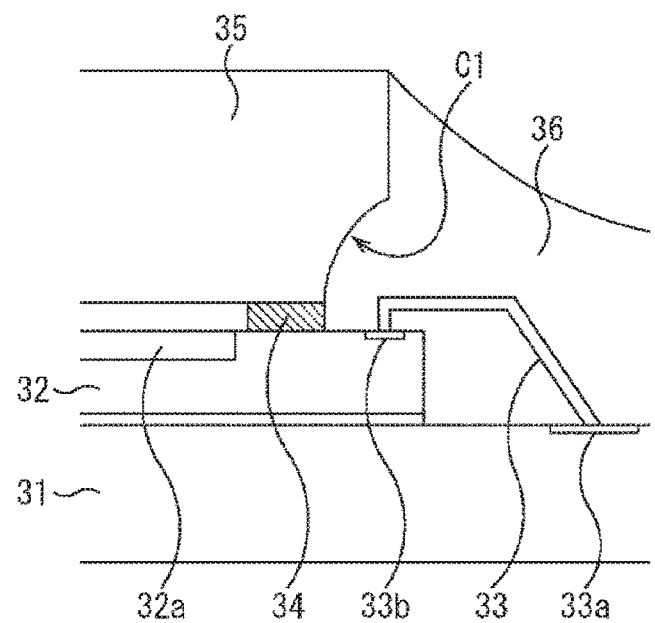
FIG. 8 is a diagram describing another example of formation of a transparent resin.

Note that, in the examples of FIGS. 6 and 7, the transparent resin 34 is formed (applied) to fill all the space between the image sensor 32 and the lower surface of the cover glass 35. Not limited thereto, for example, as illustrated in FIG. 8, the transparent resin 34 may be formed only on the outer peripheral portion of the light receiving unit 12a of the image sensor 32.

Figure 9:
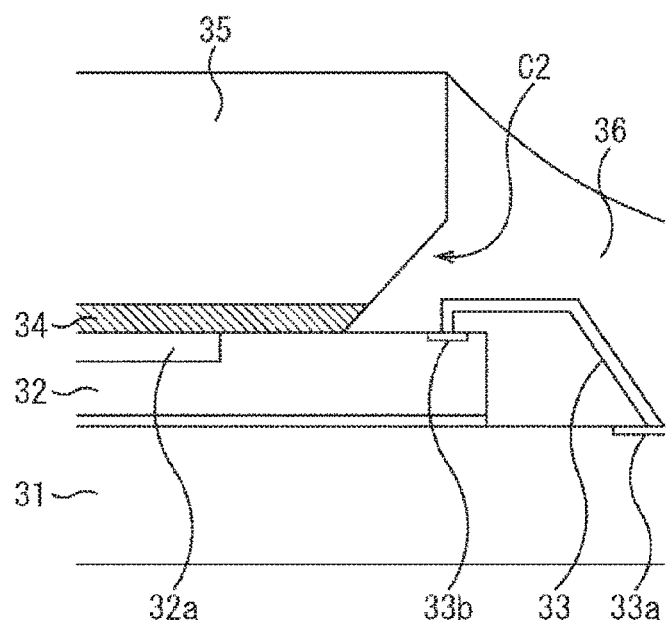
FIG. 9 is a diagram describing another shape of the chamfered portion.

In addition, in the examples of FIGS. 6 and 7, the chamfered portion C1 is formed in a reverse R surface. Not limited thereto, for example, as illustrated in FIG. 9, a chamfered portion C2 may be formed in a C surface. Also in the example of FIG. 9, the chamfered portion C2 is provided at the ridge portion of the lower surface of the cover glass 35, whereby a clearance can be secured between the cover glass 35 and the wire 33 (bonding pad 33b).

With the above configuration, the clearance between the cover glass and the wire can be increased as compared with the structure of the conventional solid-state image pickup device, so that contact can be prevented between the cover glass and the wire due to an assembly error, and the yield can be increased.

In addition, the end portion of the cover glass can be brought closer to the wire side in terms of design, so that occurrence of vignetting can be suppressed, and the degree of freedom of design can be increased.

Further, in the image sensor 32, even in a case where the distance is small between the end portion of the light receiving unit 32a and the bonding pad 33b, that is, even in a case where the area is large of the light receiving unit 32a with respect to the entire area of the image sensor 32, the design can be established, so that it is possible to cope with recent pixel size expansion.

In addition, by providing the chamfered portion on the cover glass, the interface length becomes long between the side surface of the cover glass and the sealing resin. As a result, water can be prevented from entering the light receiving unit, the entering being caused during a water resistance test or the like, and airtightness of the package can be improved.

Note that, in a cover glass without a chamfered portion, chipping and cracking often occur at the ridge portion of the lower surface of the cover glass, and as a result, there has been a possibility that the cover glass itself is broken. On the other hand, in the solid-state image pickup device of the present technology, the chamfered portion is provided on the cover glass, whereby occurrence of chipping and cracking can be suppressed, and the cover glass can be prevented from being broken.

<3. Manufacturing Process of Solid-State Image Pickup Device>

Here, a manufacturing process will be described of the solid-state image pickup device 30 described above.

Figure 10:
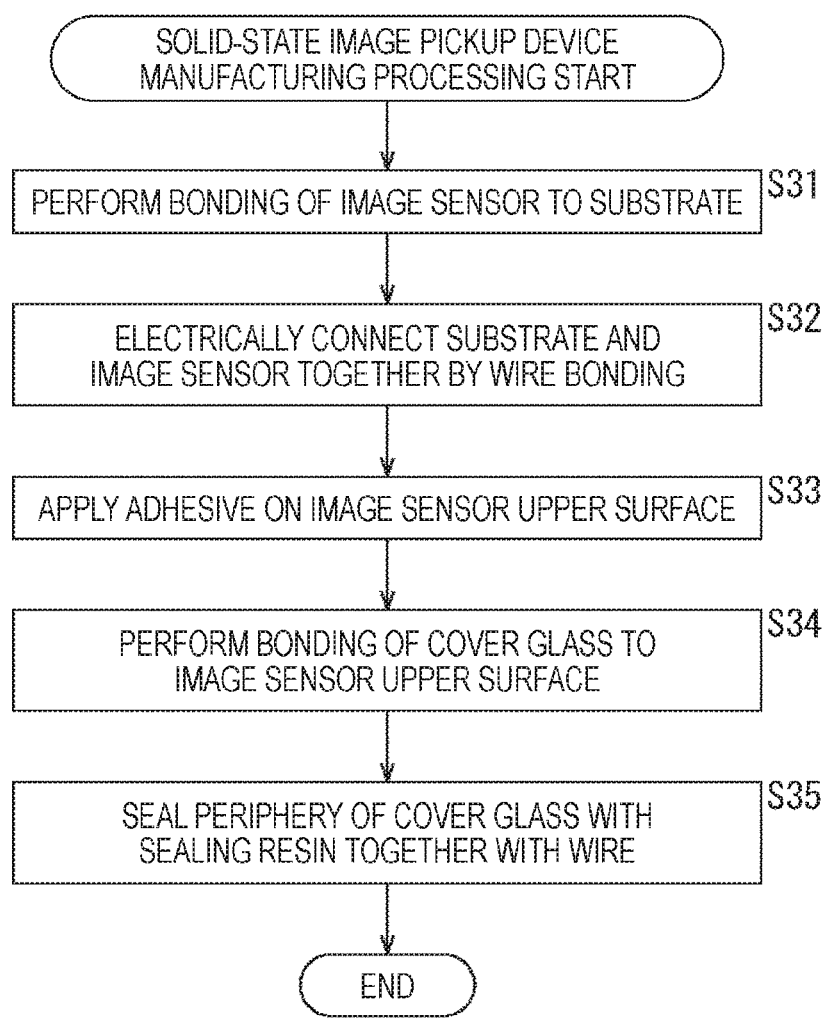
FIG. 10 is a flowchart describing a manufacturing processing of the solid-state image pickup device.

FIG. 10 is a flowchart describing manufacturing processing of the solid-state image pickup device 30, and FIGS. 11A, 11B, 11C, 12D, and 12E are diagrams describing processes in manufacturing of the solid-state image pickup device 30.

The processing of FIG. 10 is started in a state in which an adhesive is applied on the substrate 31.

In step S31, the image sensor 32 is bonded onto the substrate 31 as illustrated in process FIG. 11A. After that, heating is performed for a predetermined time, whereby the adhesive is cured.

In step S32, as illustrated in process FIG. 11B, the bonding pad 33a on the substrate 31 and the bonding pad 33b on the image sensor 32 are electrically connected together via the wire 33 by wire bonding.

In step S33, as illustrated in process C of FIG. 11C, an adhesive 34P is applied to the upper surface of the image sensor 32.

In step S34, as illustrated in process FIG. 12D, the cover glass 35 is bonded onto the upper surface of the image sensor 32. After that, the adhesive 34P is cured under a predetermined condition, whereby the transparent resin 34 is formed.

In step S35, as illustrated in process FIG. 12E, together with the wire 33, the periphery of the cover glass 35 including the chamfered portion C1 is sealed with the sealing resin 36 by a molding method or a potting method.

As described above, the solid-state image pickup device 30 of the present technology is manufactured.

<4. Formation Process of Cover Glass>

Next, a formation process will be described of the cover glass 35 in the solid-state image pickup device 30 of the present technology.

Figure 13:
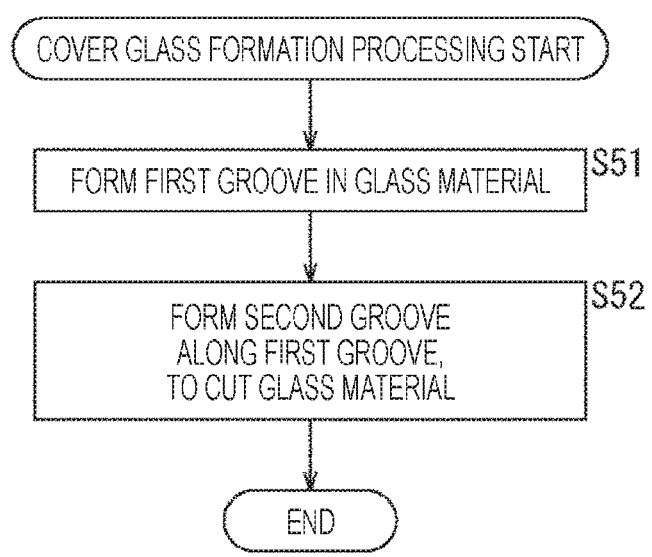
FIG. 13 is a flowchart describing formation processing of a cover glass.

FIG. 13 is a flowchart describing formation processing of the cover glass 35, and FIGS. 14A, 14B, 14C, and 14D are diagrams describing processes in formation of the cover glass 35.

In step S51, a first groove is formed in a glass material larger than the size of the cover glass 35.

Specifically, first, as illustrated in process FIG. 14A, the first groove is formed in a glass material 35M by a dicing blade 51 having a predetermined width (for example, 0.5 mm).

Here, in a case where the tip of the dicing blade 51 is rounded, the cross section of the first groove to be formed has a U-shape as illustrated in process FIG. 14B. In addition, although not illustrated, in a case where the tip of the dicing blade 51 forms an angle of 90°, the cross section of the first groove to be formed has a V-shape forming an angle of 90°.

Note that, the first groove is formed such that its depth is shallower than half the thickness of the glass material 35M.

In step S52, the second groove is formed along the first groove, whereby the glass material 35M is cut.

Specifically, as illustrated in process FIG. 14C, with a dicing blade 52 of a width (for example, 0.2 mm) narrower than the width of the opening of the first groove, that is, the width of the dicing blade 51, the glass material 35M is cut along the first groove.

As a result, as illustrated in process FIG. 14D, the cover glass 35 including the chamfered portion C1 is formed as one of individually divided pieces of the glass material 35M.

Figure 14:
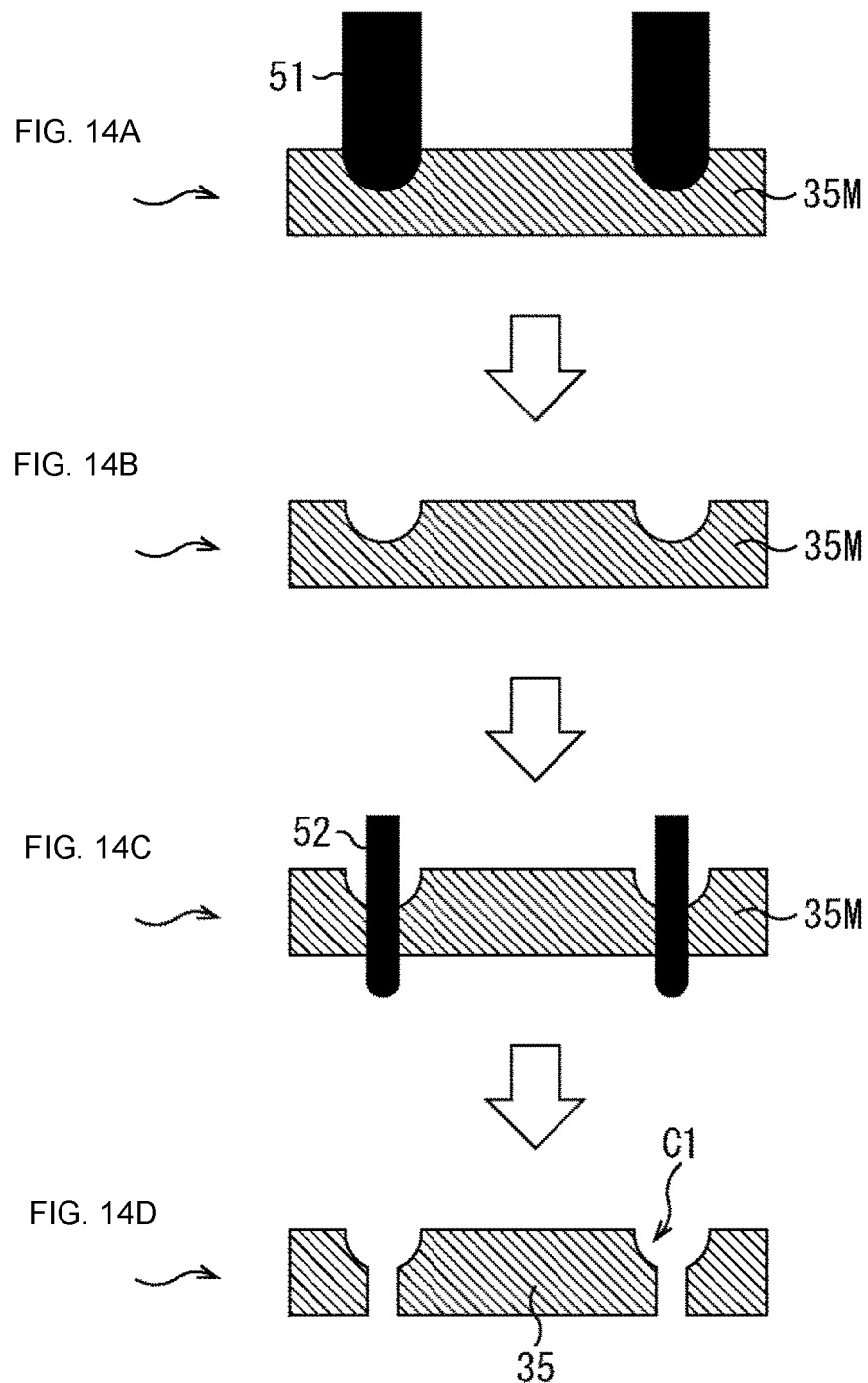
FIGS. 14A, 14B, 14C, and 14D are diagrams describing processes in formation of the cover glass.

As a result, as illustrated in process D of FIG. 14, the cover glass 35 including the chamfered portion C1 is formed as one of individually divided pieces of the glass material 35M.

Note that, in a case where the first groove is formed to have a V-shaped cross section forming an angle of 90°, the cover glass 35 is formed including the chamfered portion C2 described with reference to FIG. 9.

In addition, in the above, the first groove is formed to have a U-shaped cross section by machining using the dicing blade 51; however, it is also possible to form the first groove to have a U-shaped cross section by performing chemical processing such as etching.

Note that, the present technology is not limited to application to a solid-state image pickup device, but can also be applied to an imaging apparatus. Here, the imaging apparatus refers to a camera system such as a digital still camera or a digital video camera, or an electronic apparatus having an imaging function such as a mobile phone. Note that, there are cases where a module-like form mounted on an electronic apparatus, that is, a camera module is an imaging apparatus.

<5. Configuration Example of Electronic Apparatus>

Here, with reference to FIG. 15, a configuration example will be described of an electronic apparatus to which the present technology is applied.

Figure 15:
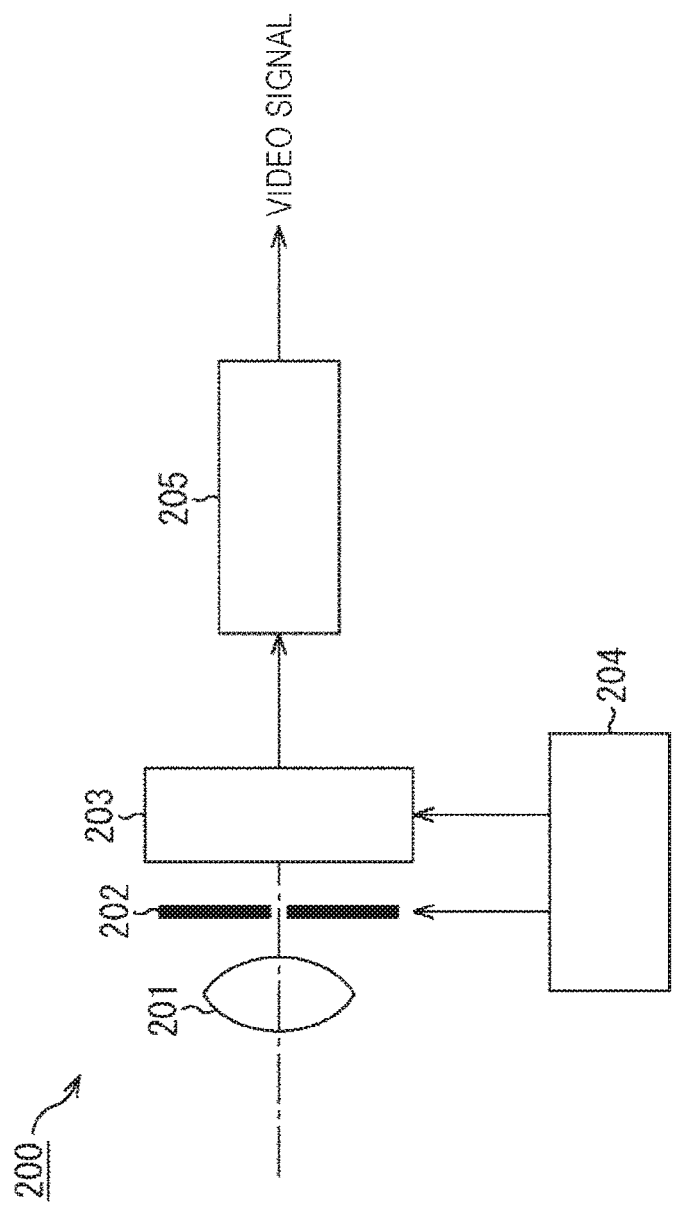
FIG. 15 is a block diagram illustrating a configuration example of an electronic apparatus of the present technology.

The electronic apparatus 200 illustrated in FIG. 15 includes an optical lens 201, a shutter device 202, a solid-state image pickup device 203, a drive circuit 204, and a signal processing circuit 205. FIG. 15 illustrates an embodiment in a case where the solid-state image pickup device 1 of the present technology described above is provided in an electronic apparatus (digital still camera), as the solid-state image pickup device 203.

The optical lens 201 forms image light (incident light) from a subject on the imaging surface of the solid-state image pickup device 203. As a result, signal charges are accumulated in the solid-state image pickup device 203 for a certain period. The shutter device 202 controls a light irradiation period and a light shielding period for the solid-state image pickup device 203.

The drive circuit 204 supplies drive signals to the shutter device 202 and the solid-state image pickup device 203. The drive signal supplied to the shutter device 202 is a signal for controlling shutter operation of the shutter device 202. The drive signal supplied to the solid-state image pickup device 203 is a signal for controlling signal transfer operation of the solid-state image pickup device 203. The solid-state image pickup device 203 performs signal transfer with the drive signal (timing signal) supplied from the drive circuit 204. The signal processing circuit 205 performs various types of signal processing on a signal output from the solid-state image pickup device 203. A video signal subjected to the signal processing is stored in a storage medium such as a memory, or output to a monitor.

In the electronic apparatus 200 of the present embodiment, occurrence of vignetting can be suppressed in the solid-state image pickup device 203, and as a result, an electronic apparatus can be provided enabled to photograph a high-quality image.

<6. Usage Examples of Image Sensor>

Finally, usage examples will be described of the image sensor included in the solid-state image pickup device to which the present technology is applied.

Figure 16:
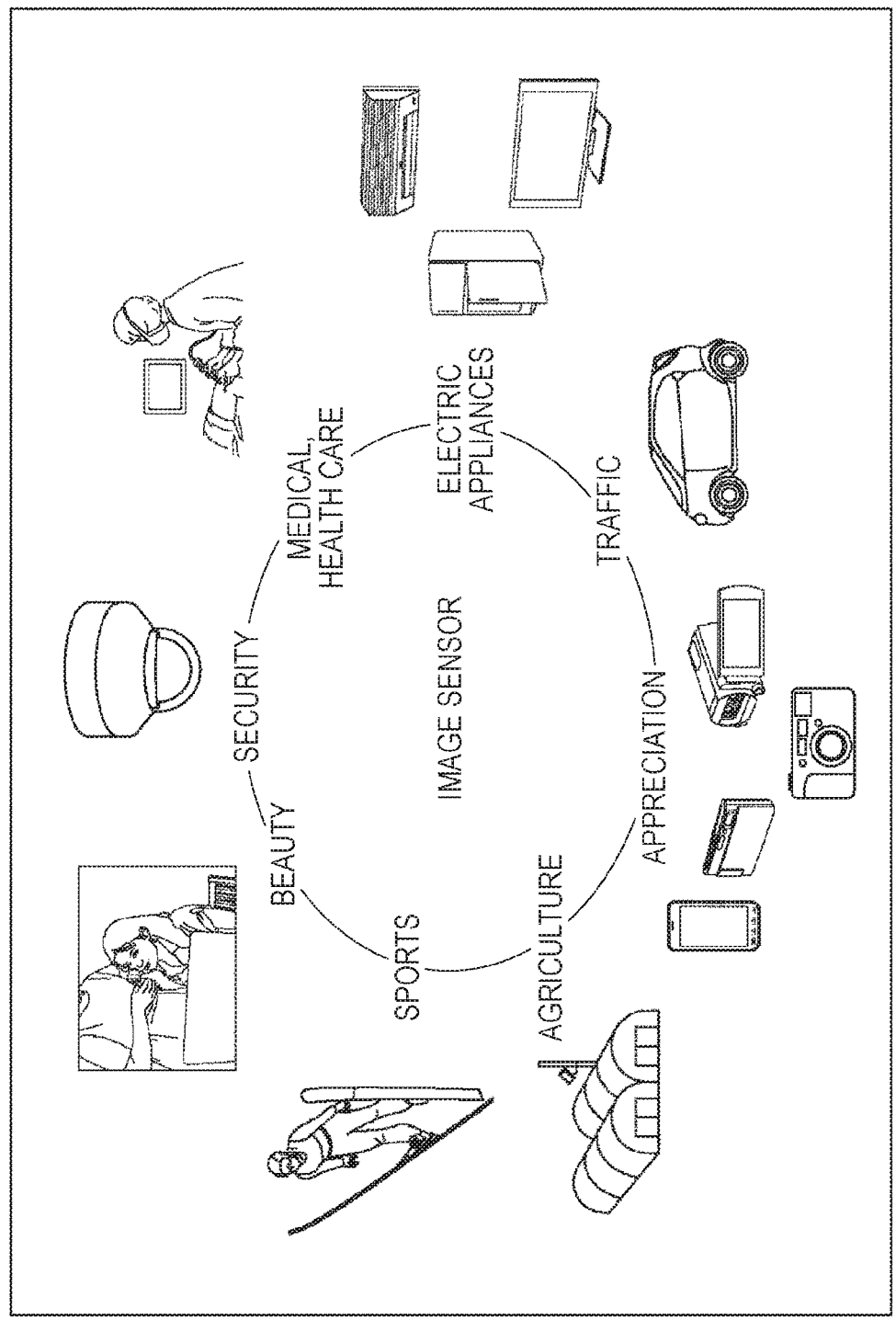
FIG. 16 is a diagram illustrating usage examples using an image sensor.

FIG. 16 is a diagram illustrating usage examples of the image sensor described above.

The image sensor described above can be used for various cases of sensing light such as visible light, infrared light, ultraviolet light, or X-rays, for example, as follows.

- An apparatus that photographs an image to be used for appreciation, such as a digital camera or a portable device with a camera function
- An apparatus to be used for traffic, such as an automotive sensor for photographing ahead of, behind, around, inside a car, and the like, a monitoring camera for monitoring traveling vehicles and roads, and a distance sensor for measuring a distance between vehicles and the like, for safe driving such as automatic stop, recognition of driver's condition, and the like
- An apparatus to be used for electric appliances, such as a TV, a refrigerator, and an air conditioner to photograph user's gesture and operate the appliances according to the gesture
- An apparatus to be used for medical care and healthcare, such as an endoscope or an apparatus for angiography by receiving infrared light
- An apparatus to be used for security, such as a monitoring camera for crime prevention applications, or a camera for person authentication applications
- An apparatus to be used for beauty, such as a skin measuring instrument for photographing skin, and a microscope for photographing a scalp
- An apparatus to be used for sports, such as a wearable camera or an action camera for sports applications or the like
- An apparatus to be used for agriculture, such as a camera for monitoring conditions of fields and crops Note that, the embodiment of the present technology is not limited to the embodiments described above, and various modifications are possible without departing from the scope of the present technology.

Further, the present technology can also adopt the following configuration.

(1)

A solid-state image pickup device including:

an optical sensor including a light receiving unit; and a cover glass provided on the light receiving unit's side of the optical sensor, in which the cover glass includes a chamfered portion at a ridge portion that surrounds a surface on the optical sensor's side.

(2)

The solid-state image pickup device according to (1), in which the chamfered portion is formed in a C surface.

(3)

The solid-state image pickup device according to (1), in which the chamfered portion is formed in a reverse R surface.

(4)

The solid-state image pickup device according to any of (1) to (3), in which the chamfered portion is formed by machining.

(5)

The solid-state image pickup device according to (1) or (3), in which the chamfered portion is formed by etching.

(6)

The solid-state image pickup device according to any of (1) to (5), further including a bonding pad arranged on a peripheral portion except for the light receiving unit, of the optical sensor.

(7)

The solid-state image pickup device according to (6), in which a shortest distance between an end portion of the light receiving unit and the bonding pad is set to less than or equal to 0.5 mm.

(8)

The solid-state image pickup device according to (6) or (7), further including a sealing resin that seals a periphery of the cover glass including the chamfered portion together with a wire connected to the bonding pad.

(9)

A manufacturing method of a solid-state image pickup device including an optical sensor including a light receiving unit, and a cover glass provided on the light receiving unit's side of the optical sensor, in which the cover glass includes a chamfered portion at a ridge portion that surrounds a surface on the optical sensor's side, the manufacturing method including:

a first step of forming a first groove having a tapered cross section along a dimension of the cover glass in a glass material larger than the cover glass; and a second step of forming a second groove narrower than a width of an opening of the first groove along the first groove, to cut the glass material.

(10)

The manufacturing method according to (9), in which in the first step, the first groove is formed by a dicing blade.

(11)

The manufacturing method according to (9), in which in the first step, the first groove is formed by etching.

(12)

The manufacturing method according to any of (9) to (11), in which in the second step, the glass material is cut by a dicing blade having a width narrower than a width of the opening of the first groove.

(13)

An electronic apparatus including:

a solid-state image pickup device including an optical sensor including a light receiving unit, and a cover glass provided on the light receiving unit's side of the optical sensor, in which the cover glass includes a chamfered portion at a ridge portion that surrounds a surface on the optical sensor's side.

REFERENCE SIGNS LIST

30 Solid-state image pickup device
31 Substrate
32 Image sensor
32a Light receiving unit
33 Wire
33a, 33b Bonding pad
34 Adhesive
35 Cover glass
36 Sealing resin
200 Electronic apparatus
203 Solid-state image pickup device

The invention claimed is:

1. A solid-state image pickup device, comprising:
an optical sensor including a light receiving unit;
a cover glass on a light receiving unit side of the optical sensor, wherein
the cover glass includes a chamfered portion at a ridge portion of a lower surface of the cover glass, and
the ridge portion surrounds a surface on the light receiving unit side of the optical sensor; and
a transparent resin between the optical sensor and the cover glass, wherein
the transparent resin is only on a portion of the optical sensor, and
the portion of the optical sensor is an area of the optical sensor except for an area between the chamfered portion of the cover glass and the surface of the optical sensor.

2. The solid-state image pickup device according to claim 1, wherein the chamfered portion is in a C surface.

3. The solid-state image pickup device according to claim 1, wherein the chamfered portion is in a reverse R surface.

4. The solid-state image pickup device according to claim 1, wherein the chamfered portion is formed by machining.

5. The solid-state image pickup device according to claim 1, wherein the chamfered portion is formed by etching.

6. The solid-state image pickup device according to claim 1, further comprising a bonding pad on a peripheral portion of the optical sensor, wherein the peripheral portion of the optical sensor is except for the light receiving unit.

7. The solid-state image pickup device according to claim 6, wherein a shortest distance between an end portion of the light receiving unit and the bonding pad is set to less than or equal to 0.5 mm.

8. The solid-state image pickup device according to claim 6, further comprising a sealing resin configured to seal a periphery of the cover glass including the chamfered portion together with a wire connected to the bonding pad.

9. An electronic apparatus, comprising:
a solid-state image pickup device that comprises:
an optical sensor including a light receiving unit;
a cover glass on a light receiving unit side of the optical sensor, wherein
the cover glass includes a chamfered portion at a ridge portion of a lower surface of the cover glass, and
the ridge portion surrounds a surface on the light receiving unit side of the optical sensor; and
a transparent resin between the optical sensor and the cover glass, wherein
the transparent resin is only on a portion of the optical sensor, and
the portion of the optical sensor is an area of the optical sensor except for the light receiving unit an area between the chamfered portion of the cover glass and the surface of the optical sensor.

* * * * *